United States Patent
Chang et al.

(10) Patent No.: US 9,774,087 B2
(45) Date of Patent: Sep. 26, 2017

(54) WIRELESS ELECTRONIC DEVICE WITH MAGNETIC SHIELDING LAYER

(71) Applicant: Apple Inc., Cupertino, CA (US)

(72) Inventors: Alvin T. Chang, Berkeley, CA (US); Anna-Katrina Shedletsky, Mountain View, CA (US); Peter Kardassakis, Mountain View, CA (US); Katherine E. Tong, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 187 days.

(21) Appl. No.: 14/503,024

(22) Filed: Sep. 30, 2014

(65) Prior Publication Data

US 2015/0351292 A1     Dec. 3, 2015

Related U.S. Application Data (60) Provisional application No. 62/005,580, filed on May 30, 2014, provisional application No. 62/009,806, filed on Jun. 9, 2014.

(51) Int. Cl.
*H05K 9/00*        (2006.01)
*H01Q 7/06*        (2006.01)
(Continued)

(52) U.S. Cl.
CPC .............. *H01Q 7/06* (2013.01); *H01Q 1/243* (2013.01); *H01Q 1/526* (2013.01); *H01Q 7/00* (2013.01);
(Continued)

(58) Field of Classification Search
CPC H01Q 7/06; H01Q 7/00; H01Q 1/243; H01Q 1/526; H05K 7/02; H05K 9/0075
(Continued)

(56) References Cited

U.S. PATENT DOCUMENTS 5,639,989 A * 6/1997 Higgins, III .......... H01L 23/552
                                                               174/386
5,768,217 A * 6/1998 Sonoda ................ G04B 47/025
                                                               343/718
(Continued)

FOREIGN PATENT DOCUMENTS

EP            2302658         3/2011
EP            2474872         7/2012
(Continued)

*Primary Examiner* — Dameon E Levi
*Assistant Examiner* — David Lotter
(74) *Attorney, Agent, or Firm* — Treyz Law Group, P.C.; G. Victor Treyz; Joseph F. Guihan (57) ABSTRACT

An electronic device may have a housing, electrical components, and other electronic device structures. A display may be mounted in the housing. The display may have a transparent display cover layer and a display layer such as an organic light-emitting diode display layer that is mounted to the underside of the transparent display cover layer. A flexible printed circuit with metal traces may be mounted under the organic light-emitting diode display layer. The metal traces may form coils for a near-field communications inductive loop antenna. A magnetic shielding layer may be interposed between the housing and the flexible printed circuit. The magnetic shielding layer may include a polymer magnetic shielding layer having magnetic material particles embedded in a polymer matrix. The magnetic shielding layer may also have a polymer-binder-free magnetic shielding layer.

16 Claims, 7 Drawing Sheets

(51) Int. Cl.
  *H01Q 7/00* (2006.01)
  *H05K 7/02* (2006.01)
  *H05K 5/00* (2006.01)
  *H01Q 1/24* (2006.01)
  *H01Q 1/52* (2006.01)

(52) U.S. Cl.
  CPC ............ *H05K 5/0017* (2013.01); *H05K 7/02* (2013.01); *H05K 9/0075* (2013.01)

(58) Field of Classification Search
  USPC ............... 343/700 MS, 702, 841, 787, 788; 455/41.1, 41.2
  See application file for complete search history.

(56) References Cited

U.S. PATENT DOCUMENTS

| | | | |
|---|---|---|---|
| 5,838,412 A * | 11/1998 | Ueda | G02B 6/0088 349/150 |
| 6,825,751 B1 | 11/2004 | Kita | |
| 7,233,291 B2 | 6/2007 | Elkobi et al. | |
| 7,506,436 B2 * | 3/2009 | Bachman | H05K 9/003 29/840 |
| 7,815,820 B2 | 10/2010 | Tan et al. | |
| 8,502,739 B2 | 8/2013 | Ollikainen et al. | |
| 8,679,393 B1 | 3/2014 | Willwerth et al. | |
| 8,766,858 B2 | 7/2014 | Li et al. | |
| 8,780,581 B2 | 7/2014 | Merz et al. | |
| 8,803,745 B2 | 8/2014 | Dabov | |
| 2006/0255945 A1 * | 11/2006 | Egbert | G06K 19/07771 340/572.7 |
| 2008/0303735 A1 * | 12/2008 | Fujimoto | H01Q 1/22 343/787 |
| 2010/0193972 A1 | 8/2010 | Yamamoto et al. | |
| 2011/0006954 A1 * | 1/2011 | Seo | H01Q 1/243 343/702 |
| 2011/0186324 A1 | 8/2011 | Hur et al. | |
| 2011/0210825 A1 | 9/2011 | Murakami et al. | |
| 2011/0222248 A1 | 9/2011 | Sakai et al. | |
| 2011/0241949 A1 | 10/2011 | Nickel et al. | |
| 2012/0028679 A1 | 2/2012 | Ozasa | |
| 2012/0133597 A1 | 5/2012 | Chen | |
| 2012/0139800 A1 * | 6/2012 | Davies | H01Q 1/243 343/702 |
| 2012/0223865 A1 | 9/2012 | Li et al. | |
| 2012/0236528 A1 * | 9/2012 | Le | H05K 9/0088 361/818 |
| 2013/0044074 A1 | 2/2013 | Park et al. | |
| 2013/0052947 A1 | 2/2013 | Kole et al. | |
| 2013/0078917 A1 | 3/2013 | Cho et al. | |
| 2013/0140965 A1 | 6/2013 | Franklin et al. | |
| 2013/0229362 A1 | 9/2013 | Liu et al. | |
| 2013/0234899 A1 * | 9/2013 | Pope | H01Q 1/243 343/702 |
| 2013/0234910 A1 | 9/2013 | Oh et al. | |
| 2013/0300618 A1 | 11/2013 | Yarga et al. | |
| 2013/0321216 A1 | 12/2013 | Jervis et al. | |
| 2014/0014732 A1 * | 1/2014 | Finn | G06K 19/077 235/492 |
| 2014/0035793 A1 * | 2/2014 | Kato | H01Q 1/243 343/867 |
| 2014/0080411 A1 | 3/2014 | Konanur et al. | |
| 2014/0132462 A1 | 5/2014 | Ying | |
| 2014/0133074 A1 | 5/2014 | Zahler et al. | |
| 2014/0170975 A1 | 6/2014 | Liao | |
| 2014/0209691 A1 * | 7/2014 | Finn | G06K 19/07769 235/492 |
| 2014/0213178 A1 * | 7/2014 | Wolff | H01P 11/00 455/41.1 |
| 2014/0218250 A1 | 8/2014 | Kim et al. | |
| 2014/0226291 A1 | 8/2014 | Gibbs et al. | |
| 2015/0035709 A1 | 2/2015 | Lim | |
| 2015/0123860 A1 * | 5/2015 | Park | H01Q 1/22 343/720 |
| 2015/0207913 A1 | 7/2015 | Nakano et al. | |
| 2015/0311960 A1 | 10/2015 | Samardzija et al. | |
| 2015/0349424 A1 * | 12/2015 | Hur | H01Q 7/06 343/788 |
| 2016/0056526 A1 | 2/2016 | Li et al. | |

FOREIGN PATENT DOCUMENTS

| | | |
|---|---|---|
| EP | 2869398 | 5/2015 |
| KR | 10-2014-0024543 | 3/2014 |
| WO | 2009014366 | 1/2009 |
| WO | 2013149515 | 10/2013 |
| WO | 2013190119 | 12/2013 |

* cited by examiner

WIRELESS ELECTRONIC DEVICE WITH MAGNETIC SHIELDING LAYER

This application claims the benefit of provisional patent application No. 62/005,580, filed May 30, 2014, and provisional patent application No. 62/009,806, filed Jun. 9, 2014 which are hereby incorporated by reference herein in their entireties.

BACKGROUND

This relates generally to electronic devices, and, more particularly, to wireless electronic devices that include magnetic shielding layers.

Wireless electronic devices include antennas. Magnetic shielding layers can be incorporated into wireless electronic devices to prevent conductive electronic device structures from disrupting antenna operation. For example, a ferrite layer that serves as a magnetic shielding layer can be interposed between an antenna and a metal structure in an electronic device to prevent disruptive eddy currents from being produced in the metal structure during operation of the antenna.

It can be challenging to incorporate a ferrite layer into an electronic device. If care is not taken, the ferrite layer will be too large and will adversely affect the size of the electronic device. Ferrite layers may also have rough surfaces and may produce stray particles that can adversely affect the smoothness of overlapping structures.

It would therefore be desirable to be able to provide improved arrangements for incorporating ferrite layers into electronic devices.

SUMMARY

An electronic device may have a housing, electrical components, and other electronic device structures. The electronic device may be a portable electronic device or other electronic equipment.

A display may be mounted in the housing. The display may have a transparent display cover layer and a display layer that produces images for a user. The images may be viewed through the display cover layer. The display layer may be an organic light-emitting diode display layer that is mounted to the underside of the transparent display cover layer.

A flexible printed circuit may be mounted under the organic light-emitting diode display layer. The flexible printed circuit may contain metal traces that form an antenna. For example, the metal traces may form coils for a near-field communications inductive loop antenna.

A magnetic shielding layer may be formed below the flexible printed circuit and antenna. The magnetic shielding layer may be interposed between the antenna and other structures in the device such as a rear housing wall in the housing, electrical components on a printed circuit board, and other conductive device structures.

The magnetic shielding layer may include a polymer magnetic shielding layer having magnetic material (e.g., particles of magnetic material) embedded in a polymer matrix (binder). The magnetic shielding layer may include, for example, a polymer ferrite layer having ferrite particles embedded in a polymer matrix. The magnetic shielding layer may also have a polymer-binder-free layer. The polymer-binder-free layer may include magnetic material such as a ferrite material (i.e., the polymer-binder-free layer may be a ferrite layer). The polymer-binder-free ferrite layer (or other polymer-binder free magnetic shielding layer) may have a larger magnetic permeability than the polymer ferrite layer (or other polymer magnetic shielding layer) and may therefore help minimize the thickness of the magnetic shielding layer. The polymer ferrite layer (or other polymer magnetic shielding layer) may provide magnetic shielding while helping to prevent irregular surface features from surface roughness and magnetic material particles associated with the polymer-binder-free ferrite layer (or other polymer-binder-free magnetic shielding layer) from propagating upwards to the organic light-emitting diode display layer.

DETAILED DESCRIPTION

An electronic device may be provided with wireless circuitry. The wireless circuitry may include one or more antennas. To minimize device size and address other layout concerns, an antenna may be placed in close proximity to conductive device structures. For example, a near-field communications (NFC) antenna or other antenna may overlap a printed circuit board that is populated with integrated circuits and other electrical components, may overlap metal housing structures such as rear housing wall, or may overlap other conductive device structures. A magnetic shielding layer may be interposed between the antenna and the conductive materials to prevent eddy currents from being induced in the conductive materials during antenna operation. If excessive eddy currents were to develop, the antenna would not be able to operate effectively.

The magnetic shielding layer may be formed from a material with a high permeability that serves as a conduit for magnetic field lines and prevents the electromagnetic fields from the antenna from reaching underlying conductive structures where eddy currents might develop. Magnetic shielding materials, which are sometimes referred to as ferrites, may be formed from ferromagnetic compounds of iron oxide and other metal oxides (as an example). Examples of ferromagnetic materials that may be used in forming magnetic shielding include manganese-zinc ferrite, nickel-zinc ferrite, zinc ferrite, barium ferrite, strontium ferrite, cobalt ferrite, iron compounds, nickel compounds, zinc compounds, nickel oxide compounds, zinc oxide compounds, non-metallic ceramic ferromagnetic compounds, rare earth materials, neodymium compounds, yttrium compounds, other rare-earth-based materials, magnetic ceramics, etc. The magnetic shielding layer may include particles of magnetic material such as flakes of magnetic material, magnetic material dust, beads of magnetic material, glass particles (e.g., glass spheres) coated with magnetic material, or other magnetic material particles.

Figure 1:
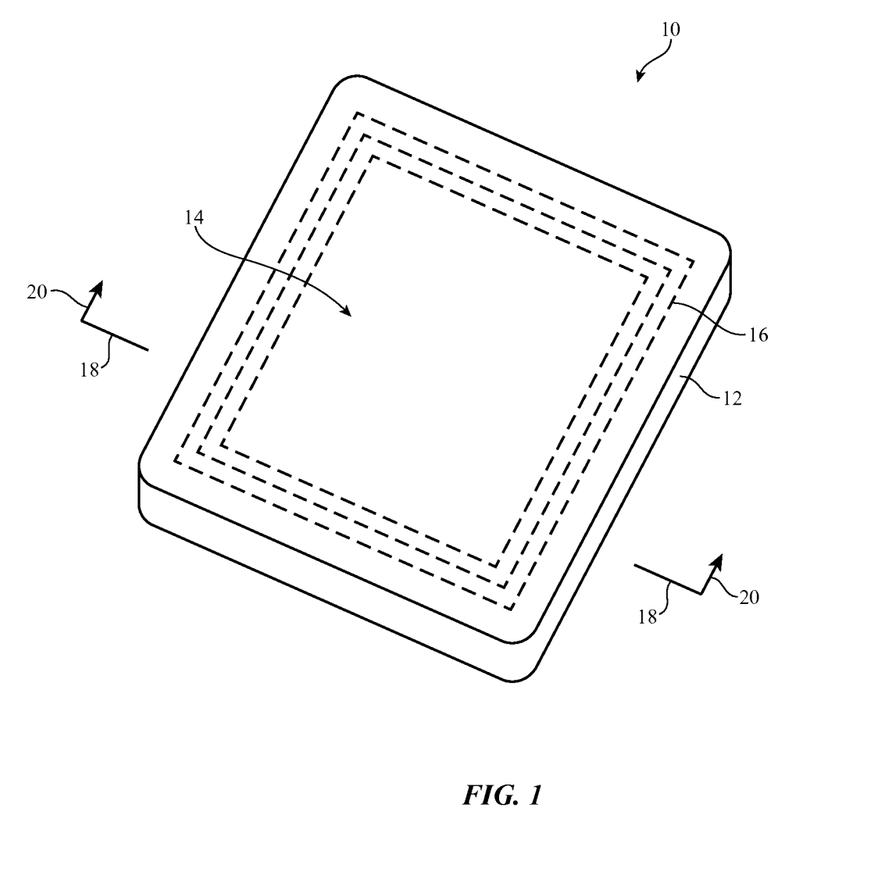
FIG. 1 is a perspective view of an illustrative electronic device in accordance with an embodiment.

FIG. 1 is a perspective view of an illustrative electronic device of the type that may be include a ferrite layer to provide magnetic shielding for an antenna. The antenna may be, for example, a near-field communications antenna operating at 13.56 MHz or other suitable frequency. An electronic device such as electronic device 10 of FIG. 1 may be a computing device such as a laptop computer, a computer monitor containing an embedded computer, a tablet computer, a cellular telephone, a media player, or other handheld or portable electronic device, a smaller device such as a wristwatch device, a pendant device, a headphone or earpiece device, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment. In the illustrative configuration of FIG. 1, device 10 is a portable device such as a cellular telephone, media player, tablet computer, wristwatch device, pendant device, or other portable computing device. Other configurations may be used for device 10 if desired. The example of FIG. 1 is merely illustrative.

Device 10 may have one or more displays such as display 14 mounted in housing structures such as housing 12. Housing 12 of device 10, which is sometimes referred to as a case, may be formed of materials such as plastic, glass, ceramics, carbon-fiber composites and other fiber-based composites, metal (e.g., machined aluminum, stainless steel, or other metals), other materials, or a combination of these materials. Device 10 may be formed using a unibody construction in which most or all of housing 12 is formed from a single structural element (e.g., a piece of machined metal or a piece of molded plastic) or may be formed from multiple housing structures (e.g., outer housing structures that have been mounted to internal frame elements or other internal housing structures).

Display 14 may be a touch sensitive display that includes a touch sensor or may be insensitive to touch. Touch sensors for display 14 may be formed from an array of capacitive touch sensor electrodes, a resistive touch array, touch sensor structures based on acoustic touch, optical touch, or force-based touch technologies, or other suitable touch sensor components.

Display 14 for device 10 may be an organic light-emitting diode display or a display formed using other display technologies (e.g., liquid crystal display technology, electrophoretic display technology, plasma display technology, electrowetting display technology, etc.).

Electronic device 10 may include one or more antennas. For example, metal lines 16 may be formed in a loop with one or more coils, as shown in FIG. 1. The loop formed from metal lines 16 may form an inductor that serves as a near-field communications inductive loop antenna. There are three turns (coils) in the illustrative inductive loop antenna of FIG. 1, but additional turns or fewer turns may be used, if desired. Metal lines 16 may be formed form metal traces on a printed circuit or other conductive structures.

Figure 2:
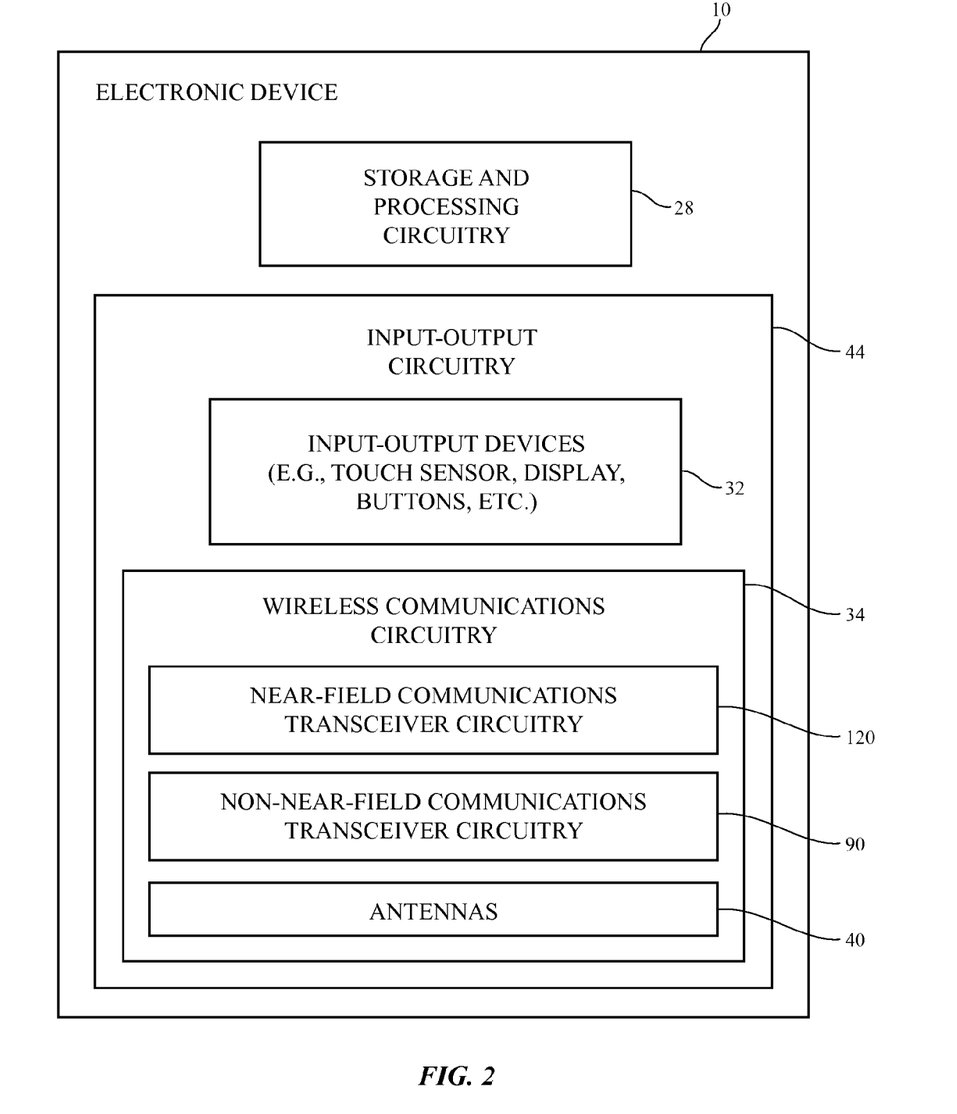
FIG. 2 is a schematic diagram of illustrative circuitry in an electronic device in accordance with an embodiment.

A schematic diagram showing illustrative components that may be used in device 10 is shown in FIG. 2. As shown in FIG. 2, device 10 may include control circuitry such as storage and processing circuitry 28. Storage and processing circuitry 28 may include storage such as hard disk drive storage, nonvolatile memory (e.g., flash memory or other electrically-programmable-read-only memory configured to form a solid state drive), volatile memory (e.g., static or dynamic random-access-memory), etc. Processing circuitry in storage and processing circuitry 28 may be used to control the operation of device 10. This processing circuitry may be based on one or more microprocessors, microcontrollers, digital signal processors, application specific integrated circuits, etc.

Input-output circuitry 44 may include input-output devices 32. Input-output devices 32 may be used to allow data to be supplied to device 10 and to allow data to be provided from device 10 to external devices. Input-output devices 32 may include user interface devices, data port devices, and other input-output components. For example, input-output devices may include touch screens (e.g., a capacitive touch sensor array that overlaps a display), displays without touch sensor capabilities, buttons, joysticks, scrolling wheels, touch pads, key pads, keyboards, microphones, cameras, buttons, speakers, status indicators, light sources, audio jacks and other audio port components, digital data port devices, light sensors, motion sensors (accelerometers), capacitance sensors, proximity sensors, etc.

Input-output circuitry 44 may include wireless communications circuitry 34 for communicating wirelessly with external equipment. Wireless communications circuitry 34 may include radio-frequency (RF) transceiver circuitry formed from one or more integrated circuits, power amplifier circuitry, low-noise input amplifiers, passive RF components, one or more antennas, transmission lines, and other circuitry for handling RF wireless signals. Wireless signals can also be sent using light (e.g., using infrared communications).

Wireless communications circuitry 34 may include radio-frequency transceiver circuitry 90 for handling various radio-frequency communications bands. For example, transceiver circuitry 90 may handle non-near-field communications bands such 2.4 GHz and 5 GHz bands for WiFi® (IEEE 802.11) communications and the 2.4 GHz Bluetooth® communications band, cellular telephone bands or other communications bands between 700 MHz and 2700 MHz, signals at 60 GHz, satellite navigation system signals, etc.

Wireless communications circuitry 34 may also have near-field communications transceiver circuitry 120. Near-field communications circuitry 120 may produce and receive near-field communications signals to support communications between device 10 and a near-field communications reader or other external near-field communications equipment. Near-field communications may be supported using loop antennas (e.g., a loop antenna formed from coils 16 of FIG. 1) to support inductive near-field communications in which a loop antenna in device 10 is electromagnetically near-field coupled to a corresponding loop antenna in a near-field communications reader. Near-field communications links may be formed over distances of 20 cm or less (i.e., these links may involve placing device 10 in the vicinity of the near-field communications reader for effective communications). Near-field communications circuitry 120 may operate at 13.56 MHz or other suitable frequency.

Wireless communications circuitry 34 may include antennas 40. Antennas 40 may be formed using any suitable antenna types. For example, antennas 40 may include antennas with resonating elements that are formed from loop antenna structures, patch antenna structures, inverted-F antenna structures, slot antenna structures, planar inverted-F antenna structures, helical antenna structures, hybrids of these designs, etc. Different types of antennas may be used for different bands and combinations of bands. For example, one type of antenna may be used in forming a local wireless link antenna and another type of antenna may be used in forming a remote wireless link antenna. In addition to supporting cellular telephone communications, wireless local area network communications, and/or other far-field wireless communications, the structures of antennas 40 may be used in supporting near-field communications. For example, antennas 40 may include a near-field communications inductive loop antenna formed from conductive paths 16 of FIG. 1. The loop antenna may be formed under display 14 (as shown in FIG. 1) or may be formed elsewhere in device 10. Multiple near-field communications antennas may be formed in device 10, if desired.

Figure 3:
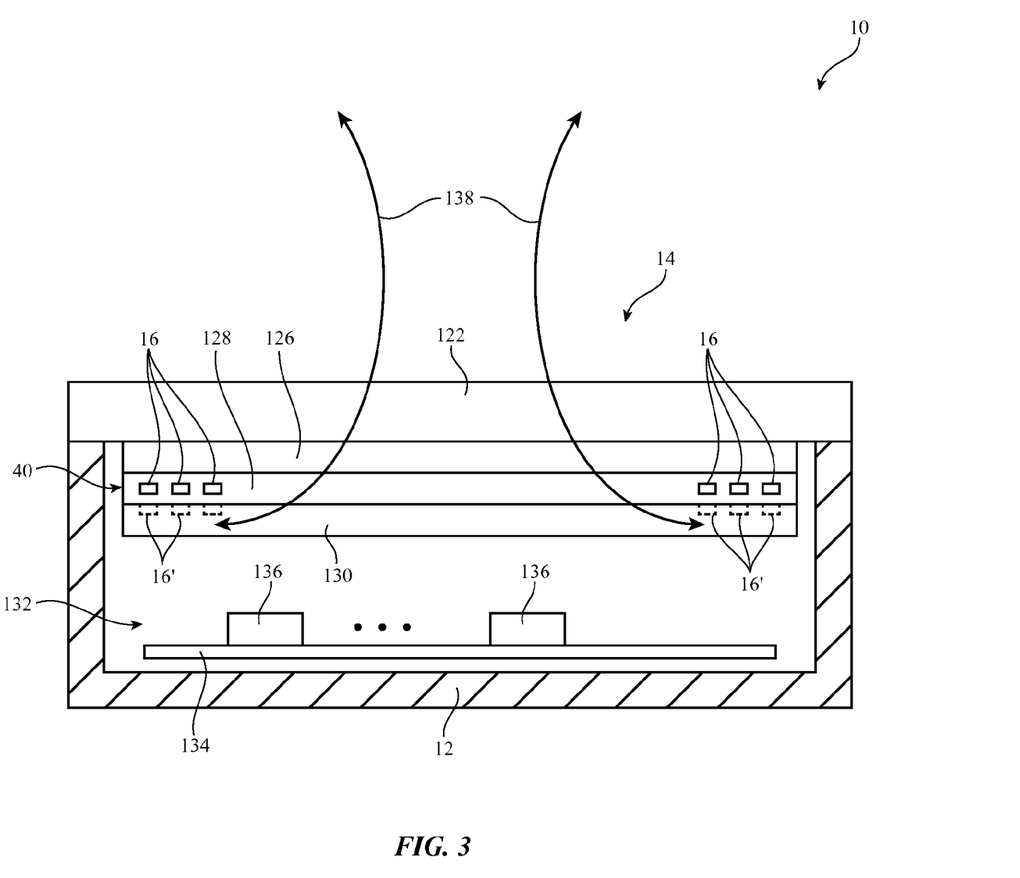
FIG. 3 is a cross-sectional side view of the illustrative electronic device of FIG. 1 in accordance with an embodiment.

A cross-sectional side view of illustrative electronic device 10 of FIG. 1 taken along line 18 and viewed in direction 20 is shown in FIG. 3. As shown in FIG. 3, display 14 of device 10 may be formed from display layer 126. Display layer 126 may be a display structure that is mounted under a cover layer such as display cover layer 122 (as an example). Display 14 (display layer 126) may be a liquid crystal display, an organic light-emitting diode display, a plasma display, an electrophoretic display, an electrowetting display, a display that is insensitive to touch, a touch sensitive display that incorporates and array of capacitive touch sensor electrodes or other touch sensor structures, or may be any other type of suitable display. Display layer (display) 126 may be formed from a flexible material such as a flexible organic light-emitting diode display substrate carrying an array of organic light-emitting diode pixels or other flexible structures. A flexible polymer layer such as a layer of polyimide may be used, for example, serve as a substrate for an organic light-emitting diode display or other display. It may be desirable to protect display layer 126 from external objects using a layer such as display cover layer 122, particularly in configurations for device 10 in which display layer 126 is based on a flexible polymer substrate. Display cover layer 122 may be layer of clear glass, a transparent plastic member, a transparent crystalline member such as a sapphire layer, or other clear structure that allows images from display layer 126 to be viewed by a user of device 10 through display cover layer 122. Display cover layer 122 and display layer 126 may be mounted in housing 12

Device 10 may have inner housing structures that provide additional structural support for display 14 and/or that serve as mounting platforms for printed circuits and other structures. Structural internal housing members may sometimes be referred to as housing structures and may be considered to form part of housing 12.

Conductive structures 132 may be mounted within housing 12 under display 14. Conductive structures 132 may include battery structures, sensors, printed circuits, integrated circuits, metal internal housing structures, etc. For example, conductive structures 132 may include electrical components 136 (e.g., integrated circuits, etc.). Components 136 may be mounted to printed circuits such as printed circuit 134. Printed circuit 134 may be a rigid printed circuit board (e.g., a printed circuit board formed from fiberglass-filled epoxy or other rigid printed circuit board material) or may be a flexible printed circuit (e.g., printed circuit formed from a sheet of polyimide or other flexible polymer layer). Patterned metal traces within printed circuit board 134 may be used to form signal paths between components 136. If desired, components such as metal connectors, metal shield cans, and other metal parts may be mounted to printed circuit 134.

Device 10 may include a near-field communications antenna such as antenna 40. Antenna 40 may be an inductive loop antenna formed from coils of metal traces 16 in printed circuit 128 (see, e.g., coils 16 of FIG. 1). Printed circuit 128 may be a rigid or flexible printed circuit. For example, printed circuit 128 may be a flexible printed circuit that is mounted to the lower surface of display layer 126. Metal traces 16 may be embedded within the polymer or other dielectric that forms flexible printed circuit 128 or may be formed on the upper or lower surface of the polymer substrate material for flexible printed circuit 128 (see, e.g., illustrative metal traces 16' on the inner surface of flexible printed circuit 128). Flexible printed circuit 128 is used to form near-field communications antenna 40, so flexible printed circuit 128 may sometimes be referred to as an antenna flex, an antenna flexible printed circuit, or an antenna layer.

A magnetic shielding layer such as layer 130 (sometimes referred to as a ferrite layer) may be formed under antenna layer 128. During operation of antenna 40, electromagnetic fields 138 are generated by antenna 40. Magnetic shielding layer 130 helps prevent electromagnetic fields 138 from penetrating through to underlying conductive structures 132 such as batteries, electrical components 136, printed circuit 134, metal housing structures (e.g., a metal housing structure such as a metal rear housing wall for housing 12 and/or internal metal housing structures), and other conductive structures. By preventing fields 138 from reaching conductive structures 132, the presence of magnetic shielding layer 130 helps prevent the formation of eddy currents in conductive structures 132 that could adversely affect the performance of near-field communications antenna 40.

Figure 4:
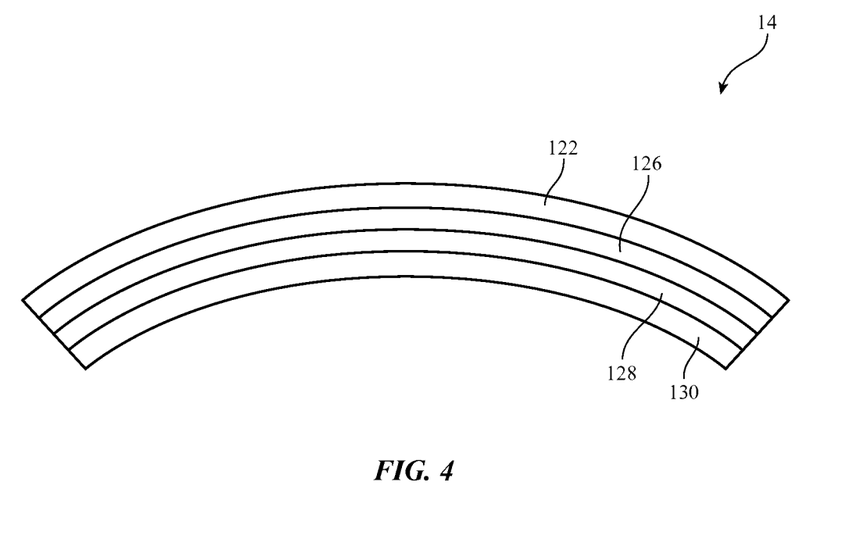
FIG. 4 is a cross-sectional side view of illustrative curved display and antenna structures in accordance with an embodiment.

As shown in FIG. 4, display 14 may, if desired, have a curved shape. For example, display 14 may have a curved display cover layer such as curved cover layer 122, may have a curved display such as curved display layer 126, may have a curved antenna layer such as layer 128, and may have a curved magnetic shielding layer such as layer 130.

One or more ferrite layers or other magnetic shielding materials may be used in forming layer 130. Ferrite layers may be formed by using rollers to attach a layer of sintered ferrite particles to a polymer liner that serves as a carrier. This type of ferrite layer is free of polymer binder material and is sometimes referred to as a polymer-binder-free ferrite layer, sintered ferrite layer, or polymer-binder-free magnetic shielding layer. The layer of sintered ferrite particles or other magnetic material particles in a polymer-binder-free layer may exhibit a high magnetic permeability, but can sometimes generate contaminant particles and exhibit surface roughness due to the presence of surface score lines. If care is not taken, surface irregularities such as these may create defects in overlapping structures. For example, visible dimples in display layer 126 can be produced, thereby adversely affecting the visual appearance of display 14. In displays such as illustrative curved display 14 of FIG. 4, the layers that make up display 14 are flexible (i.e., soft and pliable) and may therefore be susceptible to deformation from underlying particles and surface roughness. Planar displays that incorporate thin and flexible layers of material to minimize device thickness may also be vulnerable to excessive roughness and particles in layer 130.

Whether display 14 is planar or has a curved shape of the type shown in FIG. 4, it is desirable to ensure that the surface of display 14 is not adversely affected by dimples or other artifacts produced by the presence of a rough magnetic shielding layer and/or contaminant magnetic material particles. Surface roughness and particle generation can be minimized by using polymer-based magnetic materials as all or part of magnetic shielding layer 130. In a polymer-based magnetic shielding layer (e.g., a polymer ferrite), particles of magnetic material (e.g., ferrite particles) are embedded within a polymer matrix (i.e., a polymer binder material that binds the magnetic material particles into a cohesive layer). Plastic molding techniques may be used in forming sheets of the polymer magnetic shielding material. Polymer magnetic shielding layers are smoother and give rise to fewer contaminating particles than sintered (polymer-binder-free) magnetic shielding layers and can therefore help improve the appearance of display 14.

Polymer magnetic shielding layers (e.g., polymer ferrite layers) typically have magnetic permeability values that are at most a third of the magnetic permeability values available from polymer-binder-free magnetic shielding layers (e.g., sintered ferrite layers). As a result, shielding layer thickness will generally be larger for polymer magnetic shielding layers than for polymer-binder-free magnetic shielding layers when used to produce a given amount of magnetic shielding.

If desired the thin layer thickness that is achievable using a polymer-binder-free magnetic shielding material may be achieved using a hybrid approach in which magnetic shielding layer 130 is formed from layers of both polymer magnetic shielding material (e.g., polymer ferrite) and polymer-binder-free magnetic shielding material (e.g., sintered ferrite). The polymer shielding layer may be interposed between the polymer-binder-free shielding layer and antenna layer 128. With this type of approach, the upper shielding layer (i.e., the polymer shielding layer) forms a buffer that helps ensure that display 14 is unaffected by particles and roughness associated with the lower shielding layer (e.g., the sintered ferrite layer). The lower non-polymer shielding layer helps to provide sufficient magnetic permeability to the magnetic shielding layer with minimal thickness.

Figure 5:
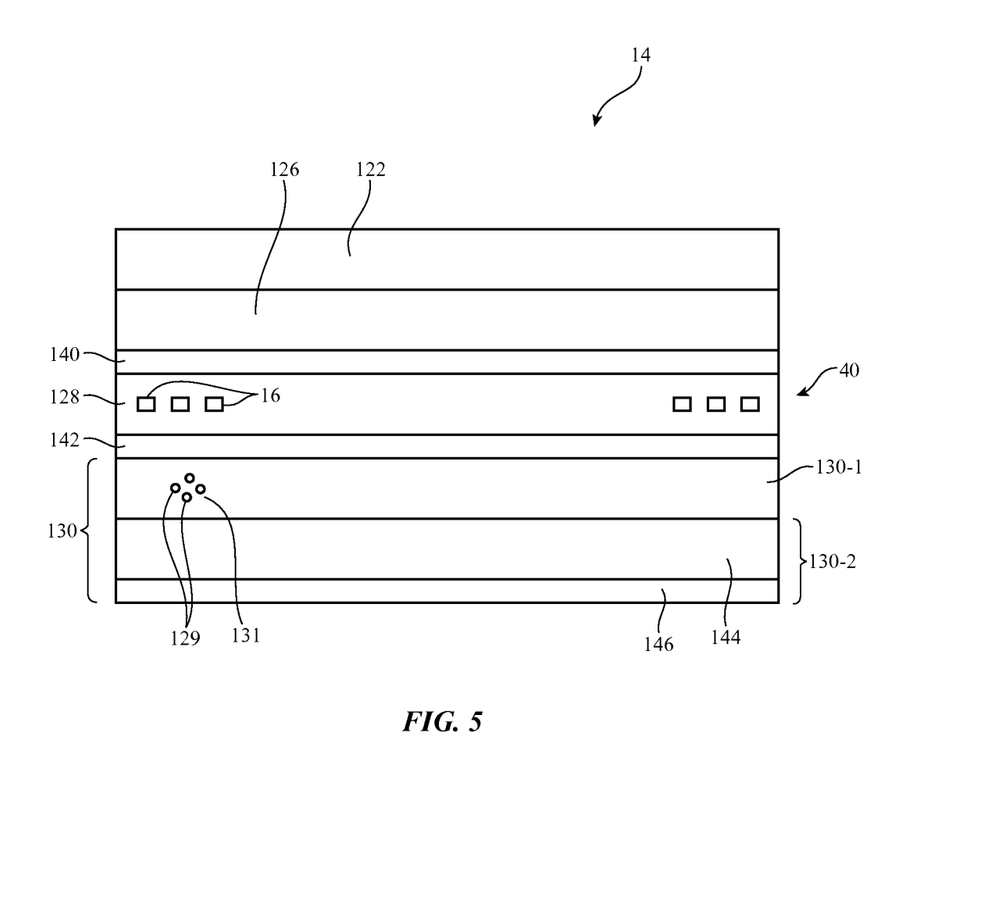
FIG. 5 is a cross-sectional side view of illustrative display and antenna structures including a magnetic shielding layer that includes a polymer-binder-free sintered ferrite layer and a polymer ferrite layer in accordance with an embodiment.

FIG. 5 is a cross-sectional side view of an illustrative hybrid magnetic shielding configuration that may be used for display 14. As shown in FIG. 5, display 14 may include display cover layer 122. Display layer 126 may be mounted to the inner surface of display cover layer 122 (e.g., using adhesive, etc.). Display layer 126 may be an organic light-emitting diode display or other display. Display cover layer 122 and the other layers of FIG. 5 may be planar or curved.

Magnetic shielding layer 130 may include polymer shielding layer 130-1 (e.g., a polymer ferrite layer) and polymer-binder-free layer 130-2 (e.g., a sintered ferrite layer). Polymer layer 130-1 may have magnetic material particles 129 (e.g., ferrite particles or particles of other magnetic material) embedded in polymer binder (matrix) 131. Layer 130-2 may include a layer of magnetic material such as sintered ferrite material 144 or other magnetic material particles (e.g., ferrite material or other magnetic material that does not include a polymer binder of the type used in polymer magnetic shielding layer 130-1) on a polymer carrier such as liner 146. Because layer 130-2 is free of polymer binder, layer 130-2 may sometimes be referred to as a polymer-binder-free layer, polymer-free magnetic material layer, polymer-binder free magnetic shielding layer, polymer-binder-free ferrite layer, or polymer-free ferrite layer.

Antenna layer 128 may include near-field communications inductive loop antenna 40 formed from metal traces 16. Metal traces for antenna 40 may be embedded within antenna layer 128 or may be formed on the upper or lower surface of antenna layer 128.

Antenna layer 128 may be interposed between magnetic shielding layer 130 and display layer 126. Layers of adhesive such as illustrative lower adhesive layer 142 and upper adhesive layer 140 may be used in attaching the layers of display 14 together. For example, upper adhesive layer 140 may be used to attach antenna layer 128 to the lower surface of display layer 126 and lower adhesive layer 142 may be used to attach magnetic shielding layer 130 to the lower surface of antenna layer 128.

Polymer-binder-free magnetic shielding layer 130-2 may contain particles (e.g., ferrite particles or other particles of magnetic material) and may be characterized by a surface roughness that is larger than polymer magnetic shielding layer 130-1. Accordingly, the presence of polymer shielding layer 130-1 between polymer-binder-free shielding layer 130-2 and the overlapping display layers in display 14 such as antenna layer 128 and display layer 126 may help to enhance the smoothness of display layer 126. Polymer magnetic shielding layer 130-1 (and if desired, soft structures such as adhesive layers 142 and 140) may serve as a buffer that helps prevent bumps arising from particles and surface roughness associated with layer 130-2 from propagating upwards to display layer 126. Layer 130-2 has a greater magnetic permeability than polymer layer 130-1, so the presence of layer 130-2 helps minimize the overall thickness of magnetic shielding layer 130. If desired, the total layer thickness of layer 130 may be about 300 microns or less, 200 microns or less, or 100 microns or less, may be in the range of 50-300 microns, 100-250 microns, or may have other suitable thickness values. Polymer magnetic shielding layer 130-1 may have a thickness that is greater than the thickness of magnetic shielding layer 130-2 or may have a smaller thickness. The thickness of polymer magnetic shielding layer 130-1 may be about 10 to 25 microns, may be more than 10 microns, may be less than 50 microns, may be less than 30 microns, or may have other suitable thickness values. The total thickness of layer 130-1 and layer 144 may be about 140 microns, may be 130-150 microns, may be more than 100 microns, or may be less than 200 microns (as examples). Layers 130-1 and 130-2 may be bonded using an interposed layer of adhesive, may be bonded by using heat and/or pressure when attaching layers 130-1 and 130-2, may be bonded by molding layer 130-1 onto layer 130-2, may be bonded by pressing these layers together after chemical, light, or physical treatment of layer 130-1 to form a tacky bonding surface, etc. These techniques may also be used to bond layer 130-1 to antenna layer 128 (with or without using interposed adhesive layer 142).

Figure 6:
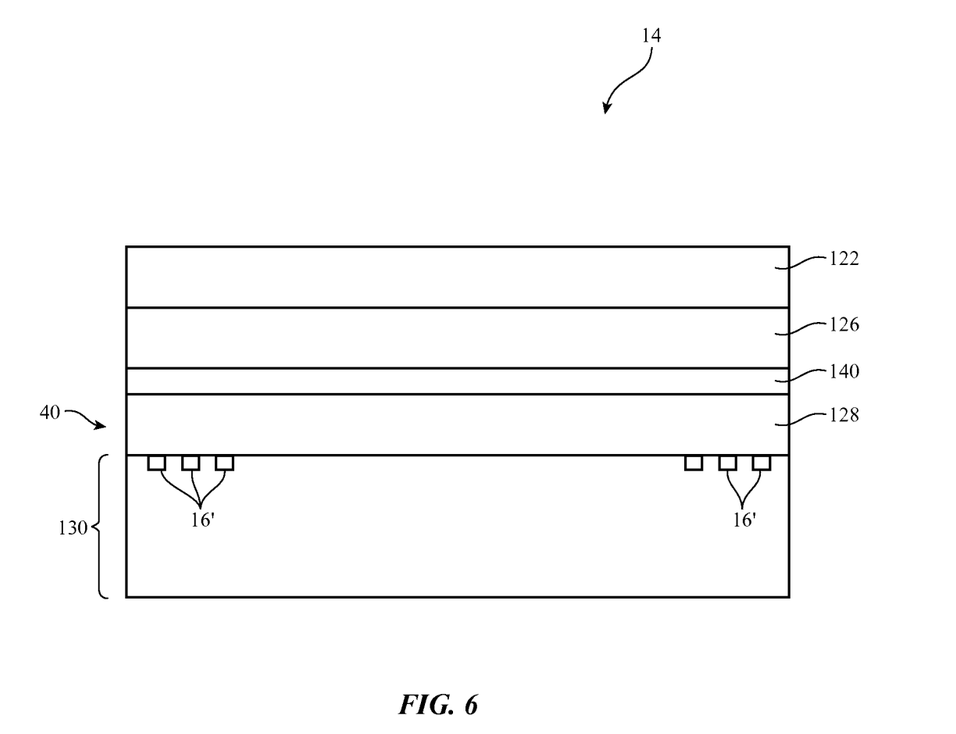
FIG. 6 is a cross-sectional side view of illustrative display and antenna structures including a magnetic shielding layer that has been formed exclusively from polymer ferrite material in accordance with an embodiment.

In the illustrative configuration of FIG. 6, magnetic shielding layer 130 has been formed of a single layer of material (e.g., polymer-binder-free ferrite or, preferably, polymer ferrite to reduce visible surface defects). When polymer magnetic shielding material is used in forming layer 130, the polymer magnetic shielding material may be molded over lines 16' on the lower surface of antenna layer 128, as shown in FIG. 6. The molding process may bond the polymer shielding layer to antenna layer 128 while conformally covering lines 16'. This type of attachment process may also be used to attach hybrid magnetic shielding layers such as layer 130 of FIG. 6 to antenna layer 128. Polymer magnetic shielding layers may also be molded to antenna layers with embedded traces.

If desired, the polymer magnetic shielding material of magnetic shielding layer 130 may be provided with raised portions, depressed portions, or other features. These features may be formed when molding the polymer magnetic shielding material. The molded features may be formed in the polymer magnetic shielding material in a hybrid design of the type shown in FIG. 5 or in polymer magnetic shielding material in a single-layer design of the type shown in FIG. 6 in which layer 130 is free of polymer-binder-free layers such as sintered ferrite layers and is formed exclusively of particles of magnetic shielding material in a polymer binder.

Figure 7:
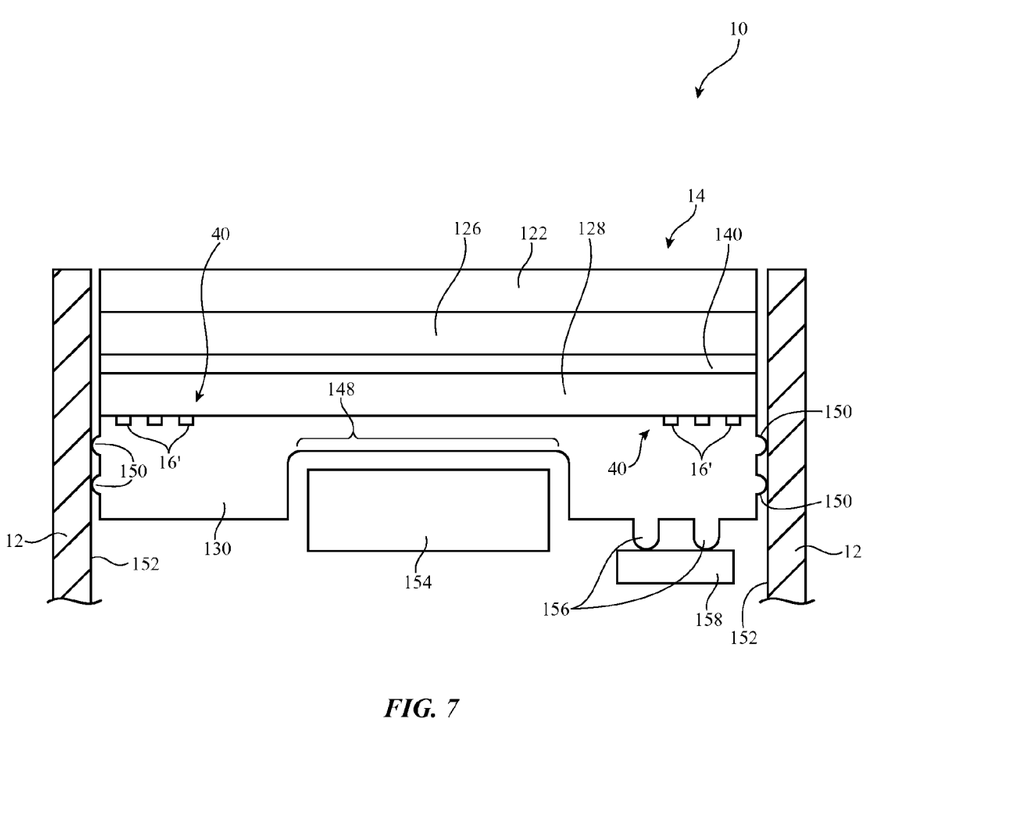
FIG. 7 is a cross-sectional side view of illustrative display and antenna structures including a polymer ferrite layer with recessed and protruding portions in accordance with an embodiment.

FIG. 7 shows an illustrative polymer magnetic shielding layer (layer 130) that has been provided with molded features. The illustrative molded features of layer 130 of FIG. 7 include recess 148 and protrusions such as side protrusions 150 and lower surface protrusions 156. The center of loop antenna 40 may require less magnetic shielding than the portion of antenna 40 in the vicinity of coils 16. Recesses such as illustrative central recess 148 may therefore be formed in the lower surface of magnetic shielding layer 130 within the center of antenna 40 (i.e., the portion of antenna 40 that is not overlapped by coils 16) without reducing the effectiveness of magnetic shielding layer 130.

Recesses such as recess 148 in layer 130 may be used to accommodate internal device structures such as structure 154. Structure 154 may include one or more electrical components such as sensors, batteries, switches, integrated circuits, or other electrical devices, may include protruding portions of internal housing structures or portions of a housing wall in housing 12, or may include other device structures.

Protrusions in layer 130 may be used to form seals. For example, lateral protrusions 150 may form seals with inner surfaces 152 of housing sidewalls, other walls in housing 12, or other structures in device 10 that are touched by protrusions 150. These seals may prevent intrusion of contaminants into the interior of device 10 (e.g., moisture, dust, etc.). Lower protrusions 156 may contact structures 158 (e.g., portions of housing 12, internal housing structures, electrical components, etc.). Protrusions 156 may form shock-absorbing mounting points for the structures of display 14 (as an example). Other types of features may be formed in layer 130 if desired (e.g., by molding, machining, etc.). The illustrative configuration of FIG. 7 is merely illustrative.

The foregoing is merely illustrative and various modifications can be made by those skilled in the art without departing from the scope and spirit of the described embodiments. The foregoing embodiments may be implemented individually or in any combination.

What is claimed is:

1. An electronic device, comprising:
    a housing;
    a display mounted in the housing, wherein the display includes a transparent display cover layer and a display layer mounted under the transparent display cover layer;
    an antenna layer including metal traces that form an antenna; and
    a magnetic shielding layer adjacent to the antenna layer, wherein the antenna layer is interposed between the magnetic shielding layer and the display, the magnetic shielding layer includes a polymer magnetic shielding layer having particles of magnetic material embedded in a polymer binder, the magnetic shielding layer includes a polymer-binder-free magnetic shielding layer having a layer of magnetic material, and the polymer magnetic shielding layer is interposed between the polymer-binder-free magnetic shielding layer and the antenna layer.

2. The electronic device defined in claim 1 wherein the display layer comprises an organic light-emitting display layer.

3. The electronic device defined in claim 1 wherein the antenna layer comprises a flexible printed circuit, the antenna comprises a near-field-communications loop antenna, and the metal traces form coils for the antenna.

4. The electronic device defined in claim 1 wherein the polymer magnetic shielding layer includes a protrusion.

5. The electronic device defined in claim 4 further comprising a structure with a surface, wherein the protrusion contacts the surface.

6. The electronic device defined in claim 1 wherein the metal traces form coils in a near-field communications inductive loop antenna.

7. The electronic device defined in claim 6 wherein the layer of magnetic material of the polymer-binder-free magnetic shielding layer is formed on a plastic liner and the layer of magnetic material is interposed between the plastic liner and the polymer magnetic shielding layer.

8. The electronic device defined in claim 7 wherein the antenna layer comprises a flexible printed circuit.

9. The electronic device defined in claim 8 wherein the display layer comprises an organic light-emitting diode display layer and the particles of magnetic material comprise ferrite particles.

10. An electronic device, comprising:
    a housing;
    a display mounted in the housing, wherein the display includes a transparent display cover layer and an organic light-emitting diode display layer mounted under the transparent display cover layer;
    a flexible printed circuit containing coiled metal traces that form a near-field communications inductive loop antenna; and
    a magnetic shielding layer, wherein the flexible printed circuit is interposed between the magnetic shielding layer and the organic light-emitting diode display layer, the magnetic shielding layer includes a polymer-binder-free magnetic shielding layer and a polymer magnetic shielding layer, the polymer magnetic shielding layer includes particles of magnetic material embedded in a polymer matrix, the polymer-binder-free magnetic shielding layer includes a layer of magnetic material, the polymer-binder-free magnetic shielding layer is formed separately from the polymer magnetic shielding layer, and the polymer magnetic shielding layer is interposed between the polymer-binder-free magnetic shielding layer and the flexible printed circuit.

11. The electronic device defined in claim 1, further comprising:
    a housing wall with an interior surface and an exterior surface, wherein the exterior surface of the housing wall forms an exterior surface for the electronic device and the polymer magnetic shielding layer includes a protrusion that directly contacts the housing wall and forms a seal with the housing wall.

12. The electronic device defined in claim 1, wherein the polymer-binder free magnetic shielding layer is formed separately from the polymer magnetic shielding layer.

13. The electronic device defined in claim 12, wherein the polymer magnetic shielding layer is smoother than the polymer-binder free magnetic shielding layer.

14. The electronic device defined in claim 1, wherein the display layer comprises a display layer selected from the group consisting of: a liquid crystal display layer, an organic light-emitting diode display layer, a plasma display layer, an electrophoretic display layer, and an electrowetting display layer.

15. The electronic device defined in claim 1, wherein the polymer-binder-free magnetic shielding layer is a sintered ferrite layer.

16. The electronic device defined in claim 10, wherein the polymer-binder-free magnetic shielding layer is a sintered ferrite layer.

* * * * *